United States Patent
Endo et al.

(10) Patent No.: US 8,164,076 B2
(45) Date of Patent: Apr. 24, 2012

(54) EXTREME ULTRAVIOLET LIGHT SOURCE APPARATUS AND METHOD OF GENERATING EXTREME ULTRAVIOLET LIGHT

(75) Inventors: Akira Endo, Jena (DE); Yoshifumi Ueno, Hiratsuka (JP); Youichi Sasaki, Oyama (JP); Osamu Wakabayashi, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 105 days.

(21) Appl. No.: 12/569,194

(22) Filed: Sep. 29, 2009

(65) Prior Publication Data

US 2010/0090133 A1    Apr. 15, 2010

(30) Foreign Application Priority Data

Sep. 29, 2008  (JP) ................................ 2008-250744
Sep. 15, 2009  (JP) ................................ 2009-212884

(51) Int. Cl.
*H05G 2/00* (2006.01)

(52) U.S. Cl. .................................................. 250/504 R

(58) Field of Classification Search .............. 250/504 R, 250/493.1; 378/119, 143
See application file for complete search history.

(56) References Cited

U.S. PATENT DOCUMENTS

| | | | |
|---|---|---|---|
| 4,704,718 A * | 11/1987 | Suckewer | 372/5 |
| 7,239,686 B2 * | 7/2007 | Berglund et al. | 378/119 |
| 7,250,621 B2 * | 7/2007 | Gaebel et al. | 250/504 R |
| 7,705,333 B2 * | 4/2010 | Komori et al. | 250/504 R |
| 2006/0215712 A1 * | 9/2006 | Ziener et al. | 372/2 |
| 2008/0149862 A1 | 6/2008 | Hansson et al. | |
| 2008/0237501 A1 * | 10/2008 | Hosokai et al. | 250/504 R |
| 2010/0051831 A1 * | 3/2010 | Tao et al. | 250/504 R |

FOREIGN PATENT DOCUMENTS

| | | |
|---|---|---|
| JP | 11-250842 | 9/1999 |
| JP | 2005-525687 | 8/2005 |
| WO | WO 03/096764 A1 | 11/2003 |

* cited by examiner

*Primary Examiner* — Kiet T Nguyen
(74) *Attorney, Agent, or Firm* — McDermott Will & Emery LLP

(57) ABSTRACT

An extreme ultraviolet light source apparatus, which is to generate an extreme ultraviolet light by irradiating a target with a main pulse laser light after irradiating the target with a prepulse laser light, the extreme ultraviolet light source apparatus comprises: a prepulse laser light source generating a pre-plasma by irradiating the target with the prepulse laser light while a part of the target remains, the pre-plasma being generated at a different region from a target region, the different region being located on an incident side of the prepulse laser light; and a main pulse laser light source generating the extreme ultraviolet light by irradiating the pre-plasma with the main pulse laser light.

18 Claims, 13 Drawing Sheets

EXTREME ULTRAVIOLET LIGHT SOURCE APPARATUS AND METHOD OF GENERATING EXTREME ULTRAVIOLET LIGHT

CROSS-REFERENCE TO RELATED APPLICATIONS

This application is based upon and claims the benefit of priority from the prior Japanese Patent Applications No. 2008-250744, filed on Sep. 29, 2008, and No. 2009-212884, filed on Sep. 15, 2009; the entire contents of which are incorporated herein by reference.

BACKGROUND OF THE INVENTION

1. Field of the Invention

The present invention relates to an extreme ultraviolet light source apparatus generating an extreme ultraviolet light by irradiating a liquid metal target with a main pulse laser light after irradiating the target with a prepulse laser light, and a method of generating an extreme ultraviolet light.

2. Description of the Related Art

In recent years, along with a progress in miniaturization of semiconductor device, miniaturization of transcription pattern used in photolithography in a semiconductor process has developed rapidly. In the next generation, microfabrication to the extent of 70 nm to 45 nm, or even to the extent of 45 nm and beyond will be required. Therefore, in order to comply with the demand of microfabrication to the extent of 32 nm and beyond, development of such on exposure apparatus combining an extreme ultraviolet (EUV) light source for a wavelength of about 13 nm and a reflection-type reduction projection optical system is expected.

As the EUV light source, there are three possible types, which are a laser produced plasma (LPP) light source using plasma generated by irradiating a target with a laser beam, a discharge produced plasma (DPP) light source using plasma generated by electrical discharge, and a synchrotron radiation (SR) light source using orbital radiant light. Among these light sources, the LPP light source has such advantages that luminance can be extremely high as close to the black-body radiation because plasma density can be made higher, luminescence only with a desired wavelength band is possible by selecting a target material, there is no construction such as electrode around a light source because the light source is a point light source with nearly isotropic angular distributions, and extremely wide collecting solid angle can be acquired, and so on. Accordingly, the LPP light source is expected as a light source for EUV lithography which requires more than several dozen to several hundred watt power.

In the EUV light source apparatus with the LPP system, firstly, a target material supplied inside a vacuum chamber is irradiated with a laser light to be ionized and thus generate plasma. Then, a cocktail light with various wavelength components including an EUV light is emitted from the generated plasma. Consequently, a desired wavelength component, which is a component with a 13.5 nm wavelength, for instance, is reflected and collected using an EUV collector mirror which selectively reflects the EUV light with the desired wavelength, and inputted to an exposure apparatus. On a reflective surface of the EUV collector mirror, a multilayer coating with a structure in that thin coating of molybdenum (Mo) and thin coating of silicon (Si) are alternately stacked, for instance, is formed. The multilayer coating has a high reflectance ratio (of about 60% to 70%) for the EUV light with a 13.5 nm wavelength.

Japanese patent application Laid-Open No. H11-250842 discloses a laser plasma light source which is a light source with a high conversion efficiency due to previously forming a trench on a solid target, gasifying a surface portion of inside the trench by irradiating the trench with an ablation laser, and thermal ionizing the gasified material by irradiating this material with a heating laser light. Here, conversion efficiency means a ratio of power of a generated EUV light with a desired wavelength to power of a laser light that entered a target. This light source is suitable for temporary observation of the extreme ultraviolet light because the conversion efficiency can be made higher. However, because of using a bulk material, it is difficult to continuously form the same trenches over a long time and continuously supply the solid targets to the trenches. Therefore, it is difficult to use the light source as a light source for the exposure apparatus that is required to drive stably over a long time.

Published Japanese Translation No. 2005-525687 of the PCT International Publication discloses a certain apparatus. In this apparatus, a second target is generated by irradiating a first target at a gaseous state which could be noble gas such as Xe, the noble gas being gas under ordinary temperature that is discharged from a nozzle by a pressure, with a first energy pulse. Then, the second target isotropically-diffused with time is irradiated with a second energy pulse in order to generate a plasma, and a radial ray is outputted from the generated plasma. However, in the case where the Xe target is used, because luminance efficiency of the desired EUV light with a 13.5 nm wavelength is low, the conversion efficiency becomes low (under 1%). Therefore, it is difficult to use such apparatus using the Xe target as a light source for the exposure apparatus.

On the other hand, US patent application Laid-Open No. 2008/0149862 discloses a laser light source using a liquid droplet C300 of Sn which is able to efficiently emit a 13.5 nm EUV light as a target. In this laser light source, firstly, as shown in FIG. 1(a), a target 300 being a liquid droplet is broken and expanded by a prepulse P300. After that, the expanded target 301 is irradiated with a main pulse P301, and an EUV light is generated. In this light source, it is possible to improve the conversion efficiency of the EUV light by using the Sn as a liquid droplet but not solid, and irradiating the shattered and expanded target with the main pulse. Thereby, the light source is able to drive stably over a long time as the laser light source for the exposure apparatus. Moreover, the conversion efficiency is improved because of using a liquid metal but not gaseous as a target.

However, when the droplet being a liquid metal is irradiated with the prepulse, the droplet will be flicked off from a droplet moving axis to be broken. Therefore, a plasma, gasified droplets and tiny droplets, or the like, will drift along an optical axis of the prepulse laser while expanding, and a lot of debris can be generated. Furthermore, also due to irradiating these drifted and expanded targets with the main pulse even more debris can be generated and fly off, if a diameter and a yield of the tiny droplets is large. The flying debris contaminate or damage neighboring optical elements such as a reflecting surface of an EUV collector mirror, for instance, and thus can decrease a reflecting ratio with respect to a 13.5 nm EUV light in a short time. Therefore, there is a problem that a light source that can be reliable for a long time can not be provided.

In addition, because the flying clustered tiny droplets are neutral particles, flight thereof can not be controlled by generating an electromagnetic field, or the like. Moreover, the difficulties of controlling a position and distribution of such flight of targets makes it difficult to adjust a spot diameter of the main pulse to the targets. Therefore, as described above, most tiny droplets are not irradiated with the main pulse but fly off around directly as debris.

BRIEF SUMMARY OF THE INVENTION

It is therefore an object of the present invention to resolve the above-described problems and to provide an extreme ultraviolet laser light apparatus which is able to stably generate reliable extreme ultraviolet lights for a long time while maintaining a high conversion efficiency, and a method of generating an extreme ultraviolet light.

In accordance with one aspect of the present invention, an extreme ultraviolet light source apparatus, which is to be generate an extreme ultraviolet light by irradiating a target with a main pulse laser light after irradiating the target with a prepulse laser light, the extreme ultraviolet light source apparatus comprises: a prepulse laser light source generating a pre-plasma by irradiating the target with the prepulse laser light while a part of the target remains, the pre-plasma being generated at a different region from a target region, the different region being located at an incident side of the prepulse laser light; and a main pulse laser light source generating the extreme ultraviolet light by irradiating the pre-plasma with the main pulse laser light.

In accordance with another aspect of the present invention, a method of generating an extreme ultraviolet light by irradiating a target with a main pulse laser light after irradiating the target with a prepulse laser light, comprises the steps of: a pre-plasma generating step where a pre-plasma is generated by irradiating the target with the prepulse laser light while a part of the target remains, the pre-plasma being generated at a different region from a target region, the different region being located on an incident side of the prepulse laser light; and an extreme ultraviolet light generating step where the extreme ultraviolet light is generated by irradiating the pre-plasma with the main pulse laser light.

These and other objects, features, aspects, and advantages of the present invention will become apparent to those skilled in the art from the following detailed description, which, taken in conjunction with the annexed drawings, discloses preferred embodiments of the present invention.

DETAILED DESCRIPTION OF THE INVENTION

Exemplary embodiments of an extreme ultraviolet light source apparatus according to the present invention will be described below in detail with reference to the accompanying drawings.

Figure 2:
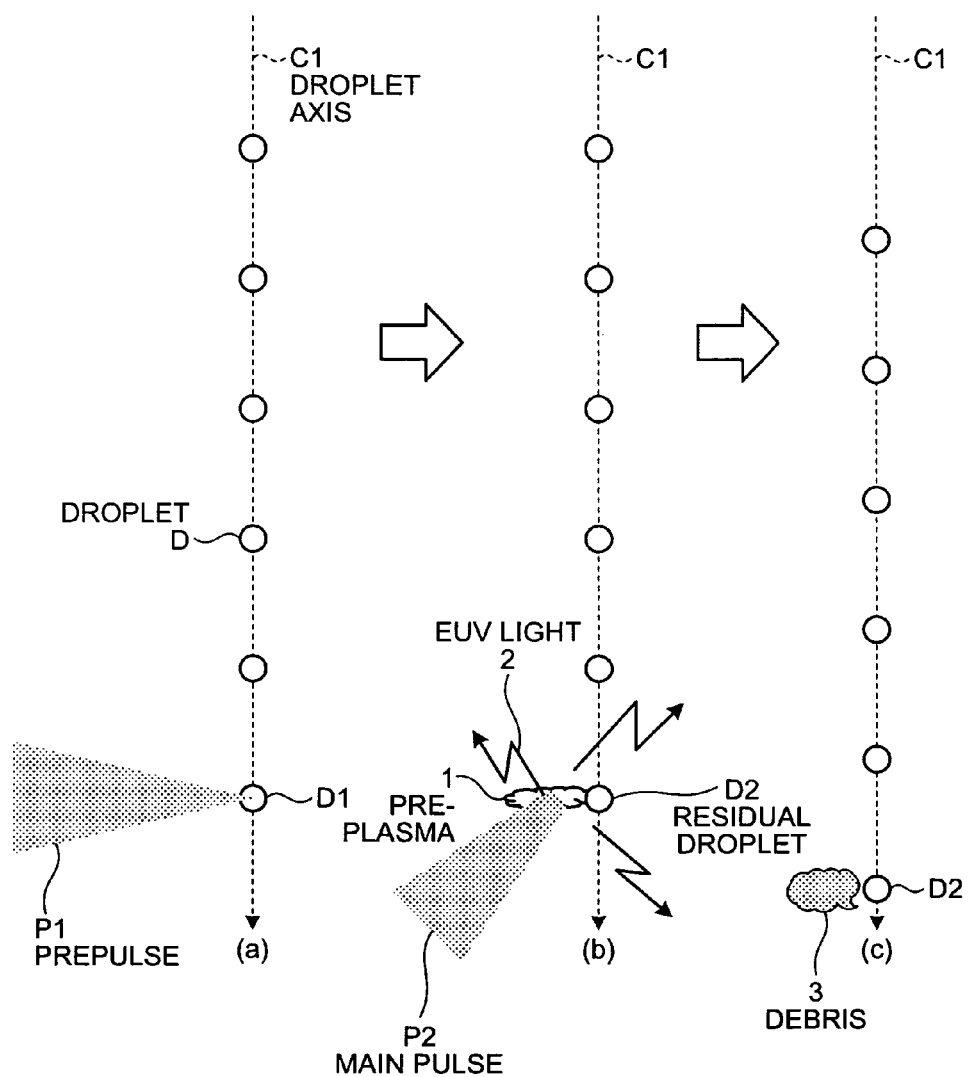
FIG. 2 is a schematic view showing a concept of a luminescent process of an extreme ultraviolet light by an extreme ultraviolet light source apparatus according to a first embodiment of the present invention.
Figure 3:
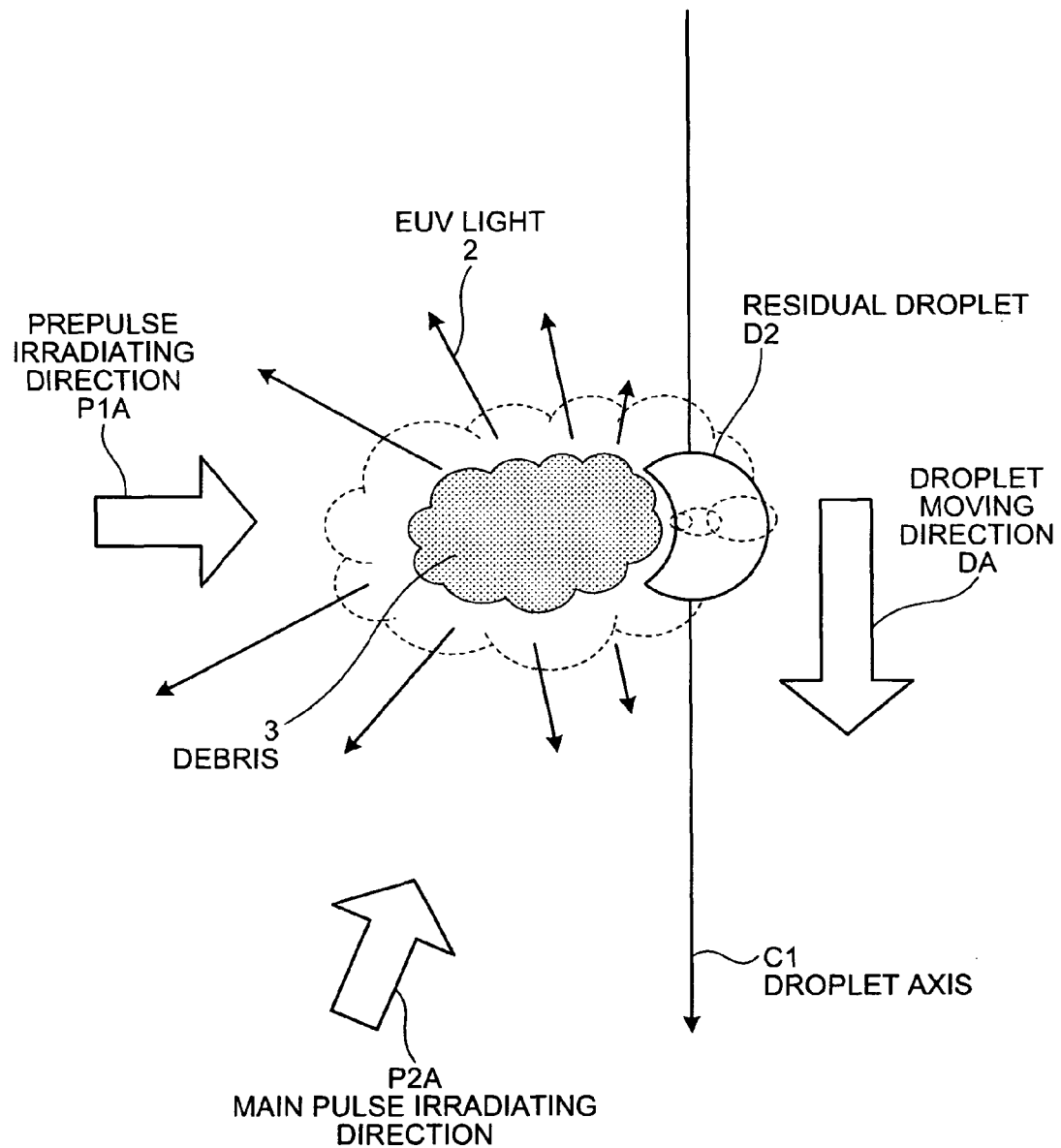
FIG. 3 is a schematic view showing a relationship between debris flying from a plasma after EUV luminescence and a residual droplet.

Firstly, a concept in an aspect of the present invention will be described in detail with reference to FIGS. 2 and 3. In FIG. 2, a droplet D of Sn being a liquid metal is discharged from a nozzle along a droplet axis C1 as a target. As shown in FIG. 2(a), the droplet D1 arrived at a predetermined position is irradiated with a prepulse P1 emitted from a prepulse laser, and as shown in FIG. 2(b), the droplet D1 becomes a pre-plasma 1 due to ablation by the prepulse P1. Here, the pre-plasma 1 is assumed as being in a weak plasma state to such extent that an part near a irradiated surface of the droplet does not emit an EUV light or being in a mixed state of a neutral gas (steam) and the weak plasma. In the following descriptions and drawings, the weak plasma state and the mixed state of the neutral gas and the weak plasma will be called as the pre-plasma.

A non-broken residual droplet D2 which is a non-ablated part of the droplet remains while the pre-plasma 1 is generated. Here, the pre-plasma 1 is generated in a direction opposite to an irradiation direction of the prepulse P1, whereas the residual droplet D2 does not move so much from the droplet axis C1. Therefore, a region of the residual droplet D2 and a region of the pre-plasma 1 will be at a state separated from each other. After a short time Δt from irradiation of the prepulse P1, as shown in FIG. 2(b), a desired 13.5 nm EUV light 2 will be isotropically emitted from the main pulse laser, as a main pulse P2 is irradiated only to the pre-plasma 1. After that, as shown in FIGS. 2(c) and 3, the residual droplet D2 that remains after the generation of the desired EUV light 2 moves to a droplet moving direction DA approximately along the droplet axis C1.

Here, fragment that can be caused by the droplet being broken by the prepulse P1 is not caused in the residual droplet D2, and generation of debris will not occur because the residual droplet 2 is not irradiated with the main pulse P2. Furthermore, the region of the pre-plasma 1 is irradiated with the main pulse P2, and the EUV light 2 is emitted from the irradiated region. As a result, because debris 3 is generated only from the region of the pre-plasma 1, it is possible to enormously reduce a yield of the debris 3, and it is possible to enormously reduce contaminations on reflective surfaces of neighboring optical elements such as the EUV collector mirror, and so on, for instance. By this arrangement, a light source being reliable for a long time can be provided.

Figure 1:
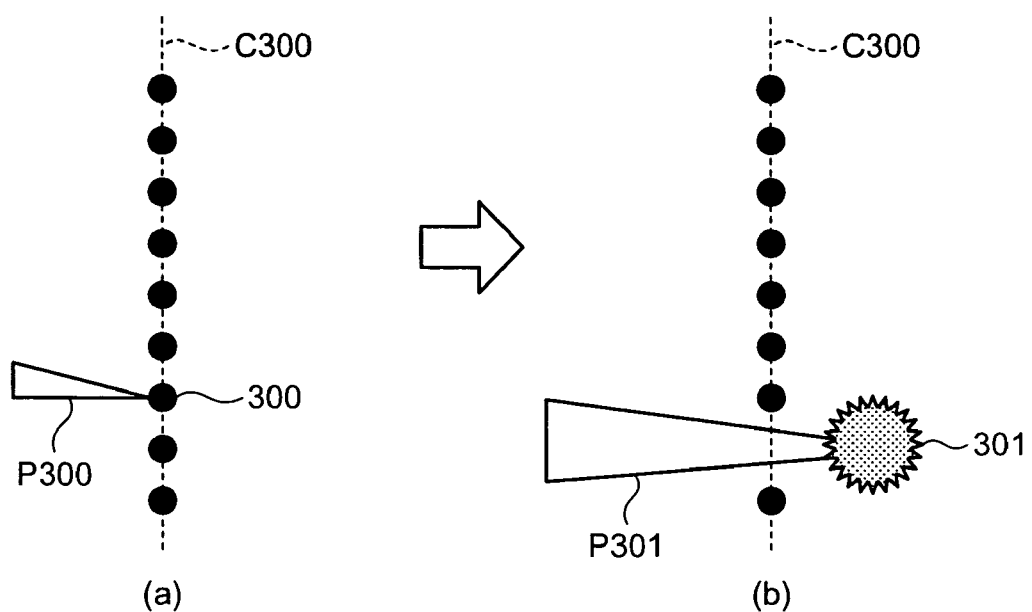
FIG. 1 is a schematic view showing a luminescent state of an extreme ultraviolet light when a prior art extreme ultraviolet light source apparatus is used.

In addition, the inventors of the present invention find out that it is possible to obtain a conversion efficiency which is approximately equal to the conversion efficiency according to the light source apparatus shown in FIG. 1 even if only the pre-plasma 1 is irradiated with the main pulse P2. In this case, a laser intensity of the prepulse P1 is equal to or less than $1 \times 10^9$ W/cm² but does not fall bellow $1 \times 10^7$ W/cm² in order to obtain a desired EUV light 2. In addition, a YAG laser with a wavelength of 1.064 μm is used for the prepulse laser, and a $CO_2$ laser with a wavelength of 10.6 μm is used for the main pulse laser. A repetition rate is equal to or more than 7 kHz. Accordingly, the droplet D is also discharged synchronously at one or more times the repetition rate.

Here, a spot diameter of the prepulse P1 with respect to the droplet D1 is equal to or less than a diameter of the droplet D1, and the spot diameter of the main pulse P2 with respect to the pre-plasma 1 is approximately equal to the diameter of the pre-plasma 1. Moreover, a prepulse irradiating direction P1A of the prepulse P1 is a different direction from a main-pulse irradiating direction P2A of the main pulse P2, and focusing positions of the prepulse P1 and the main pulse P2 differ from each other. Unlike the case of the prior art (FIG. 1), the focusing position of the main pulse P2 is located near a center of the pre-plasma 1 generated at a front of the incident side of the prepulse laser on the droplet D1.

Because the pre-plasma 1 includes ions, the pre-plasma 1 can be controlled to have a position and distribution of the space of the pre-plasma 1 controlled by using an electromagnetical field.

First Embodiment

Figure 4:
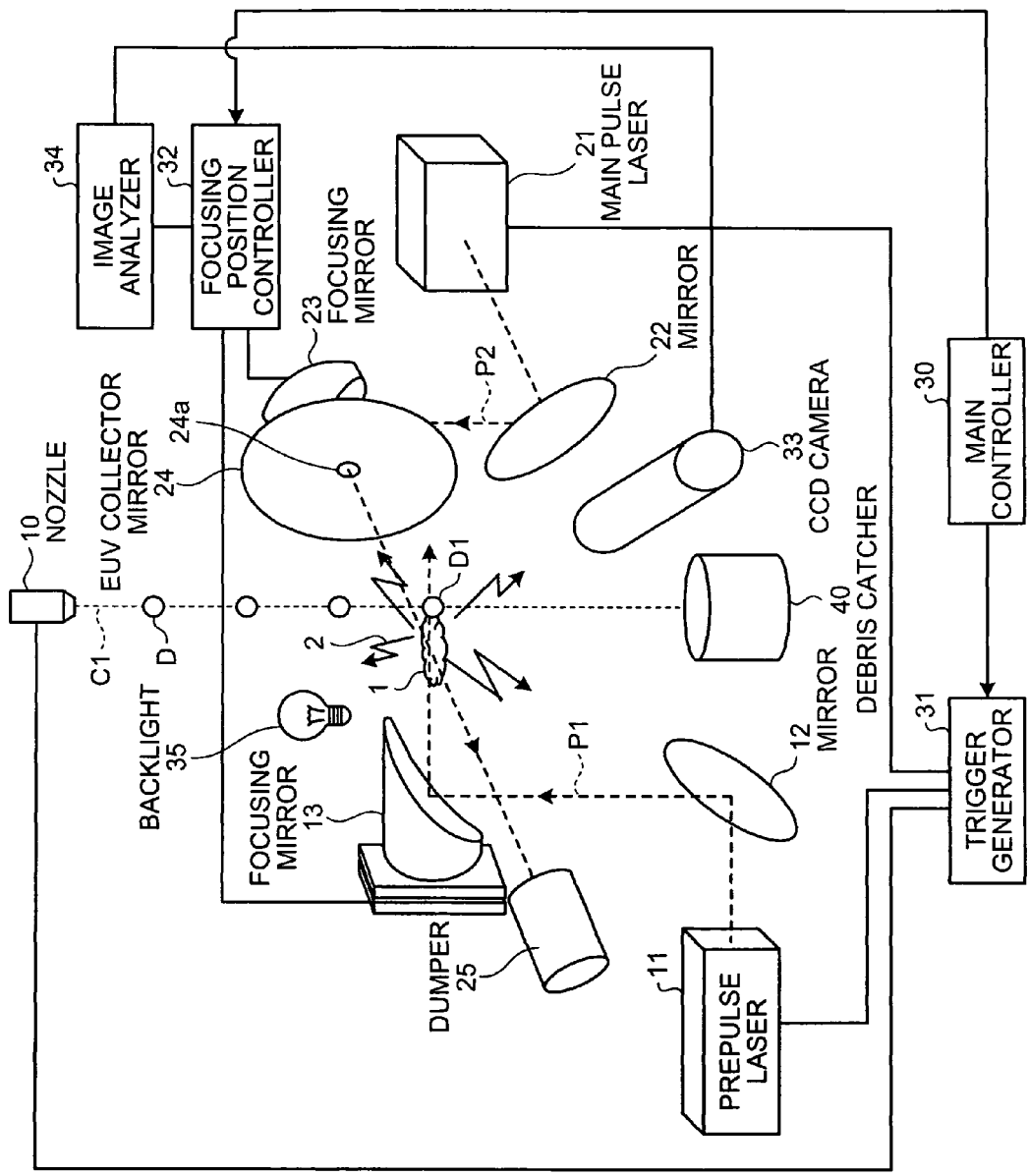
FIG. 4 is a schematic view showing a structure of the extreme ultraviolet light source apparatus according to the first embodiment of the present invention.

Next, an extreme ultraviolet light source apparatus according to a first embodiment of the present invention will be described in detail with reference to FIG. 4. In FIG. 4, the extreme ultraviolet light source apparatus has a nozzle 10 to discharge droplets D of Sn into a vacuum chamber (not shown), a prepulse laser 11 being a YAG laser which emits the prepulse P1 with a 1.064 μm wavelength to the droplet D1 inside the vacuum chamber at the repetition rate of 7 kHz or over, and a main pulse laser 21 being a $CO_2$ laser which emits the main pulse laser P2 with a 10.6 μm wavelength to the pre-plasma 1 generated inside the vacuum chamber at the repetition rate of 7 kHz or over which is the same with the prepulse P1. Intensity of the prepulse P1 is equal to or greater than $1 \times 10^7$ W/cm² but not exceeding $1 \times 10^9$ W/cm². The intensity of the prepulse P1 is to the extent that enables generation of the pre-plasma 1 which is capable of emitting the desired and sufficient 13.5 nm EUV light 2 from a part of the droplet D, and generation of the residual droplet D2 which is a part of the non-broken droplet D.

The prepulse laser 11 generates the pre-plasma 1 outside a region of the residual droplet D2 by irradiating the droplet D1 arriving at a predetermined position with the prepulse P1 via a mirror 12 and a focusing mirror 13.

On the other hand, the main pulse laser 21 generates the EUV light 2 by irradiating only the pre-plasma 1 generated by the prepulse P1 via a mirror 22, an off-axis parabolic focusing mirror 23, an aperture 24a of an EUV collector mirror 24 of which reflective surface is an elliptical surface. The main pulse P2 is finally absorbed by a dumper 25.

The EUV collector mirror 24 with the elliptical surface collects the generated EUV light 2, and the collected EUV light 2 is inputted to a side of the exposure apparatus outside the chamber (not shown).

A trigger generator 31 generates generating timing of the prepulse P1 in the prepulse laser 11, generating timing of the main pulse P2 in the main pulse laser 21, and discharge timing of the droplet D from the nozzle 10 by adjustment under control of a main controller 30. In this arrangement, the trigger generator 31 synchronizes irradiating timing of the prepulse P1 and the main pulse P2 at a predetermined space position of the droplet D1 while conforms the discharge rate of the droplet D to the repetition rate of the prepulse P1 and the main pulse P2.

An image analyzer 34 takes an image of a reflected light from the droplet D1 illuminated by a backlight 35 and an image of an illumination of the pre-plasma 1 using a CCD camera 33, and analyzes the optical received image. A focusing position controller 32 controls focusing positions and directions of the focusing mirrors 13 and 23 based on the analysis result from the image analyzer 34.

In addition, the residual droplet D2 is retrieved by a debris catcher 40 mounted in the droplet moving direction DA.

In such the structure, the pre-plasma 1 is generated at a front of the incident side of the prepulse P1 on the droplet D1 by irradiating the falling droplet D1 with prepulse P1, and after the shot time Δt, the EUV light 2 is generated by irradiating the pre-plasma 1 with the main pulse P2. The generated EUV light 2 is outputted outside via the EUV collector mirror 24. In addition, an optimum range of the short time Δt is 50 ns to 100 ns. As described above, because only minimal debris from the pre-plasma 1 are generated due to the residual droplet D2 not being irradiated with the main pulse p2, it is possible to enormously reduce contaminations on the reflective surface of the EUV collector mirror 24, etc. due to the debris, and it is possible to provide a light source being reliable for a long time. Furthermore, because the droplet of the Sn being a liquid metal is used and the pre-plasma 1 is effectively irradiated with the main pulse P2, it is possible to attain a high conversion efficiency which is the same with the case where the expanded target being generated by crashing the whole droplet using the prepulse P1 is irradiated with the main pulse.

Second Embodiment

Figure 5:
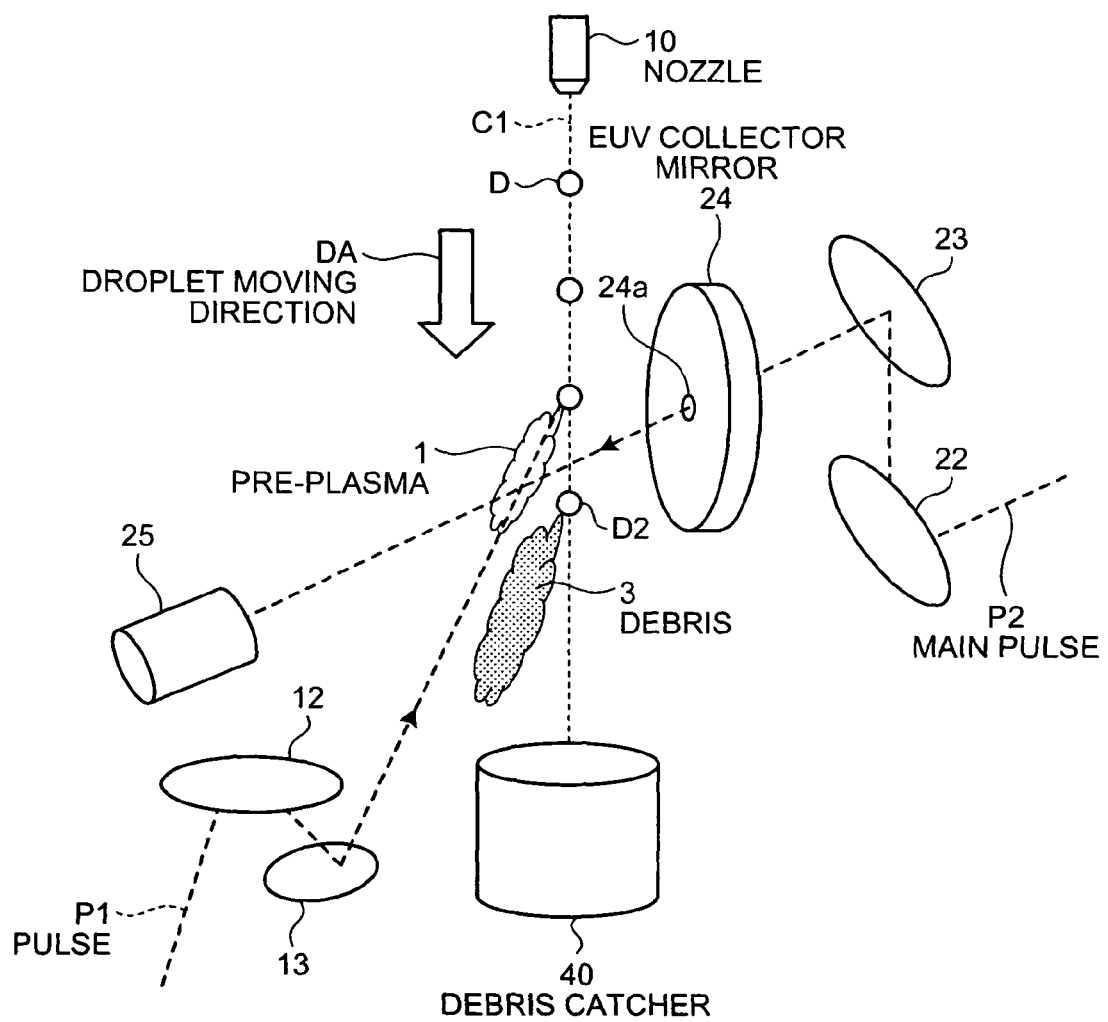
FIG. 5 is a schematic view showing a structure of an extreme ultraviolet light source apparatus according to a second embodiment of the present invention.

In the first embodiment described above, the case where the prepulse P1 is emitted in the direction approximately perpendicular to the droplet axis C1 has been described. On the other hand, in the second embodiment, as shown in FIG. 5, the prepulse P1 is emitted in a direction approximately along the droplet axis C1.

By this arrangement, due to the debris 3 from the pre-plasma 1 being generated along the droplet axis C1 after the pre-plasma 1 is irradiated with the main pulse P2, the debris catcher 40 can easily retrieve not only the residual droplet D2 but also the debris 3 generated from the pre-plasma 1. In this case, an aperture of the debris catcher 40 can be designed based on how the debris 3 expand from the droplet axis C1. Accordingly, it is possible to keep an amount of the flying debris 3 to a minimum. In addition, as shown in FIG. 5, due to the EUV collector mirror 24 being mounted in the direction perpendicular to a flying direction of the debris 3, i.e. the moving direction of the droplet D, it is possible, particularly, to effectively prevent the reflective surface of the EUV collector mirror 24 from contamination by debris.

Position Control Example of Prepulse

Figure 6:
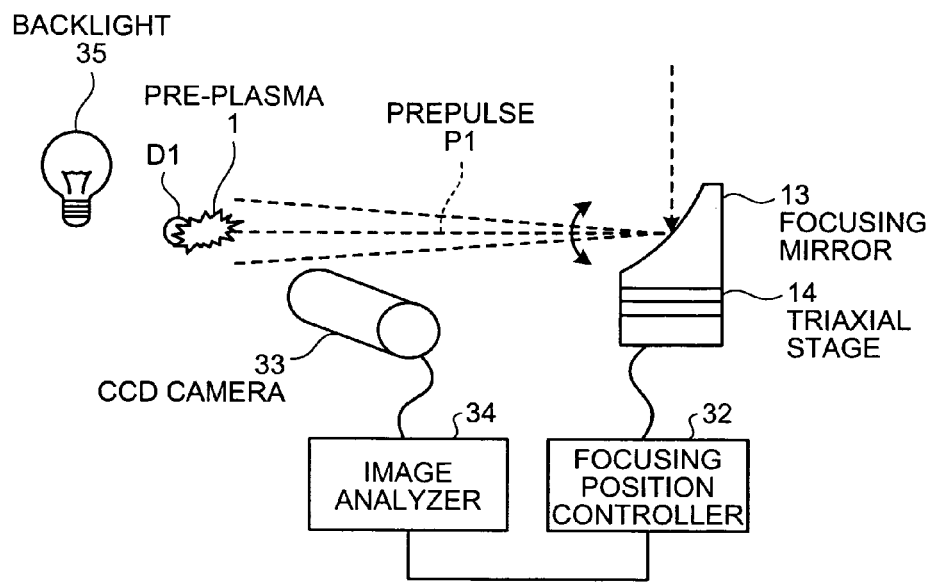
FIG. 6 is a schematic view showing a position control system for prepulse (phase 1)

Here, a position control of the prepulse P1 outputted from the prepulse laser 11 will be described. As shown in FIG. 6, a luminous point which is specified from the image of the luminescence of the pre-plasma 1 taken by the CCD camera 33 may be determined as a focus position of the prepulse P1. In this case, the position control of the prepulse P1 is executed as the image analyzer 34 specifies the luminous point of the pre-plasma 1 and the focusing point controller 32 controls a triaxial stage of the focusing mirror 13 such that the specified position becomes a desired focusing position of the prepulse P1.

Figure 7:
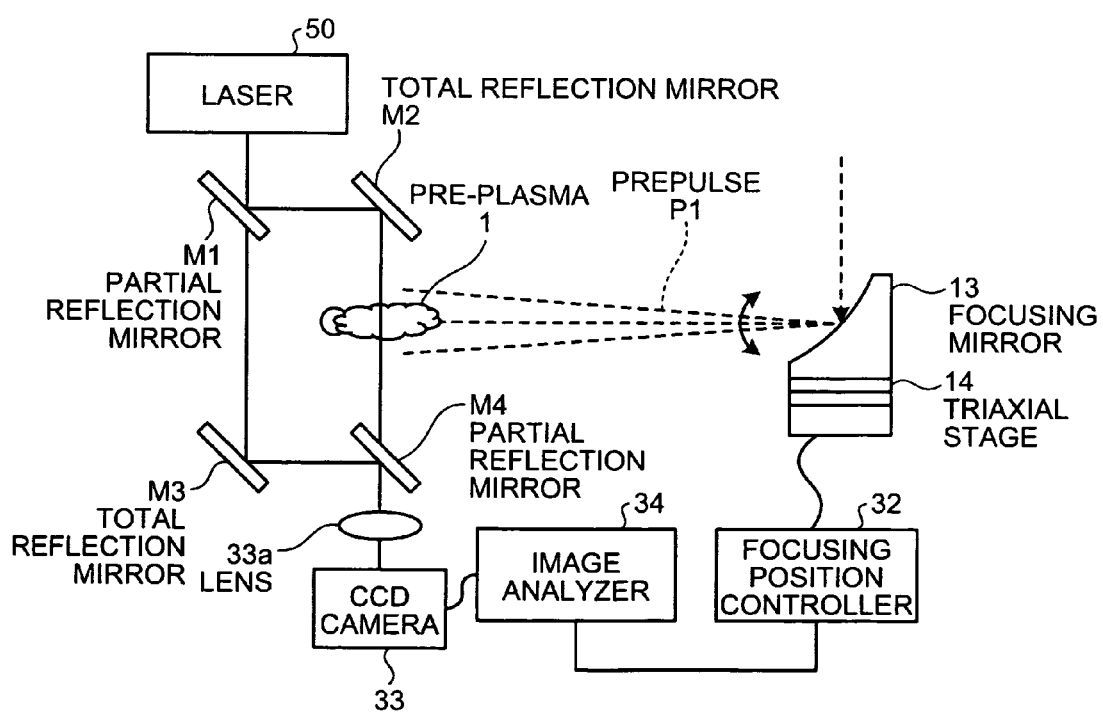
FIG. 7 is a schematic view showing the position control system for prepulse (phase 2)

Moreover, as shown in FIG. 7, the position control of the prepulse P1 may be executed using a laser interferometer. In this embodiment, a Mach-Zehnder interferometer is used. In particular, a partial reflection mirror M1, a total reflection mirror M2, a total reflection mirror M3, and a partial reflection mirror M4 are mounted between a laser 50 as a light source and a lens 33a in order to form two optical paths, one optical path passing through the laser 50, a partial reflection mirror M1, the total reflection mirror M2 and the partial reflection mirror M4, and the other optical path passing through the laser 50, the partial reflection mirror M2, the total reflection mirror M3 and the partial reflection mirror M4. In this arrangement, interference between the two optical paths will be measured. Subsequently, the laser interferometer is arranged so that the pre-plasma 1 is located on the one optical path, i.e. the pass between the total reflection mirror M2 and the partial reflection mirror M4.

The CCD camera 33 takes an image of an interference pattern occurred by existence of the pre-plasma 1 via the lens 33a. The image analyzer 34 analyzes the imaged interference pattern. The focusing position controller 32 specifies a position for making a density of the pre-plasma 1 become a density to which the EUV luminous efficiency by the main pulse P2 is optimal as the focus position of the prepulse P1 based on the interference pattern that depends on a density of the region of the pre-plasma 1, and controls the triaxial stage of the focusing mirror 13 so that the specified position becomes a desired focus position of the prepulse P1. By such processes, the position control of the focus position of the prepulse P1 is executed. Here, when a main laser is a $CO_2$ laser, a high conversion efficiency can be obtained if the density of the pre-plasma is approximately $10^{18}$/cc.

In addition, as shown in FIG. 7, it is preferable that a light source of the interferometer is a laser. The image taken by the CCD camera 33 is analyzed as the interference pattern caused by the spatial distribution of refractive index that depends on the density of the pre-plasma 1, as described above. This is because, by such arrangement that a fringe number with respect to change of refractive index becomes dense by shortening a wavelength of the light source of the interferometer, it is possible to measure a plasma with a weaker density state.

Figure 8:
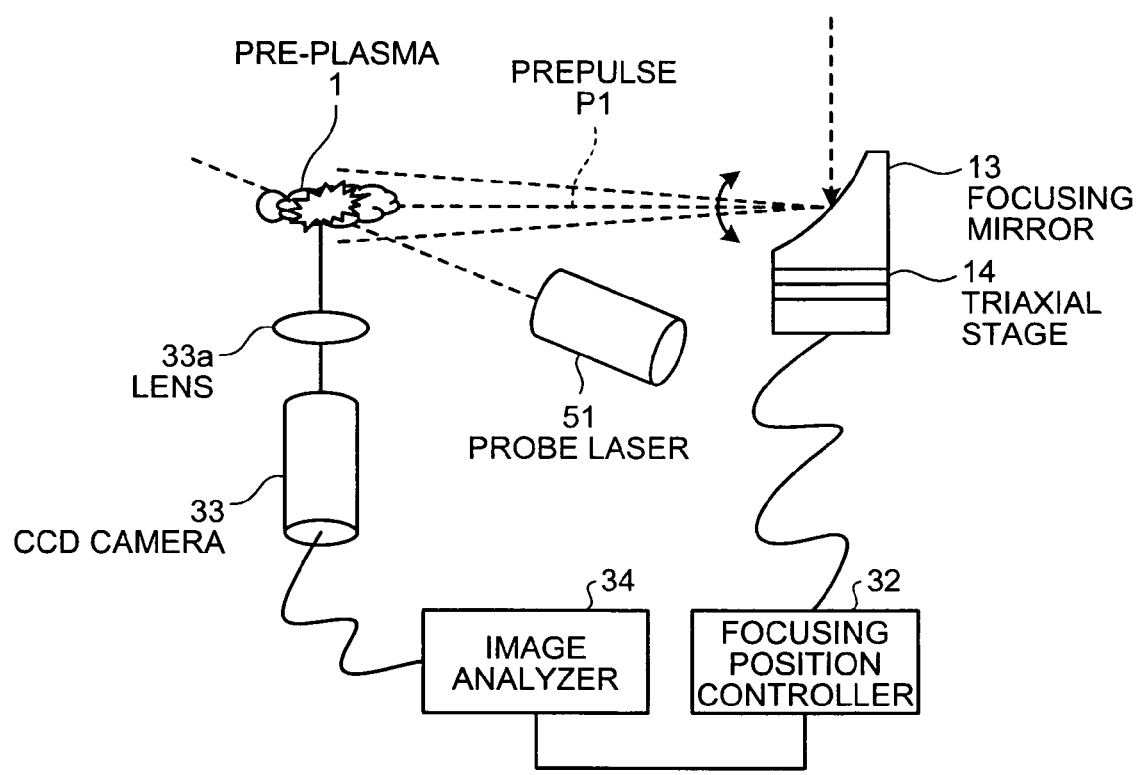
FIG. 8 is a schematic view showing the position control system for prepulse (phase 3)

Furthermore, as shown in FIG. 8, the focusing position of the prepulse P1 may be controlled based on observing scattering light using the CCD camera 33, the scattering light occurring by the pre-plasma 1 being irradiated with a probe laser 51. In this case, the shorter the wavelength and the higher the intensity of the probe laser 51 are, the higher the intensity of the scattering light from the pre-plasma 1 becomes. Therefore, a signal intensity detected by the CCD camera 33 becomes higher, whereby it is possible to take an image of which S/N ratio is larger. Herewith, the position control of the focus position of the prepulse P1 is executed by a way that the image analyzer 34 analyzes the position and the distribution of the pre-plasma 1 based on the image taken by the CCD camera 33, and the focusing position controller 32 specifies the focus position of the prepulse P1 based on the analysis result and controls the triaxial state of the focusing mirror 13 such that the specified focus position becomes the desired focus position.

However, if the prepulse P1 is outputted at a repetition rate equal to or greater than over 7 to 100 kHz, the position control with analyzing all of the repeated images is not realistic. Actually, it is possible to execute the position control while feed backing an average ranging from several micro seconds to several seconds to a triaxial stage 14.

A single CCD camera 33 is used for the position control of the prepulse P1 in FIGS. 6 to 8. However, because the focus position is a three-dimensional location, at least two CCD cameras are required.

In the embodiment shown in FIGS. 6 to 8, the off-axis parabolic focusing mirror is used as an optical focusing system of the prepulse laser. However, the present invention is not limited to this example. The focus position of the prepulse may be controlled by using a focusing lens, locating a highly-reflective mirror ahead or behind the focusing lens, and locating the highly-reflective mirror on the triaxial stage.

Timing Control Example

Figure 9:
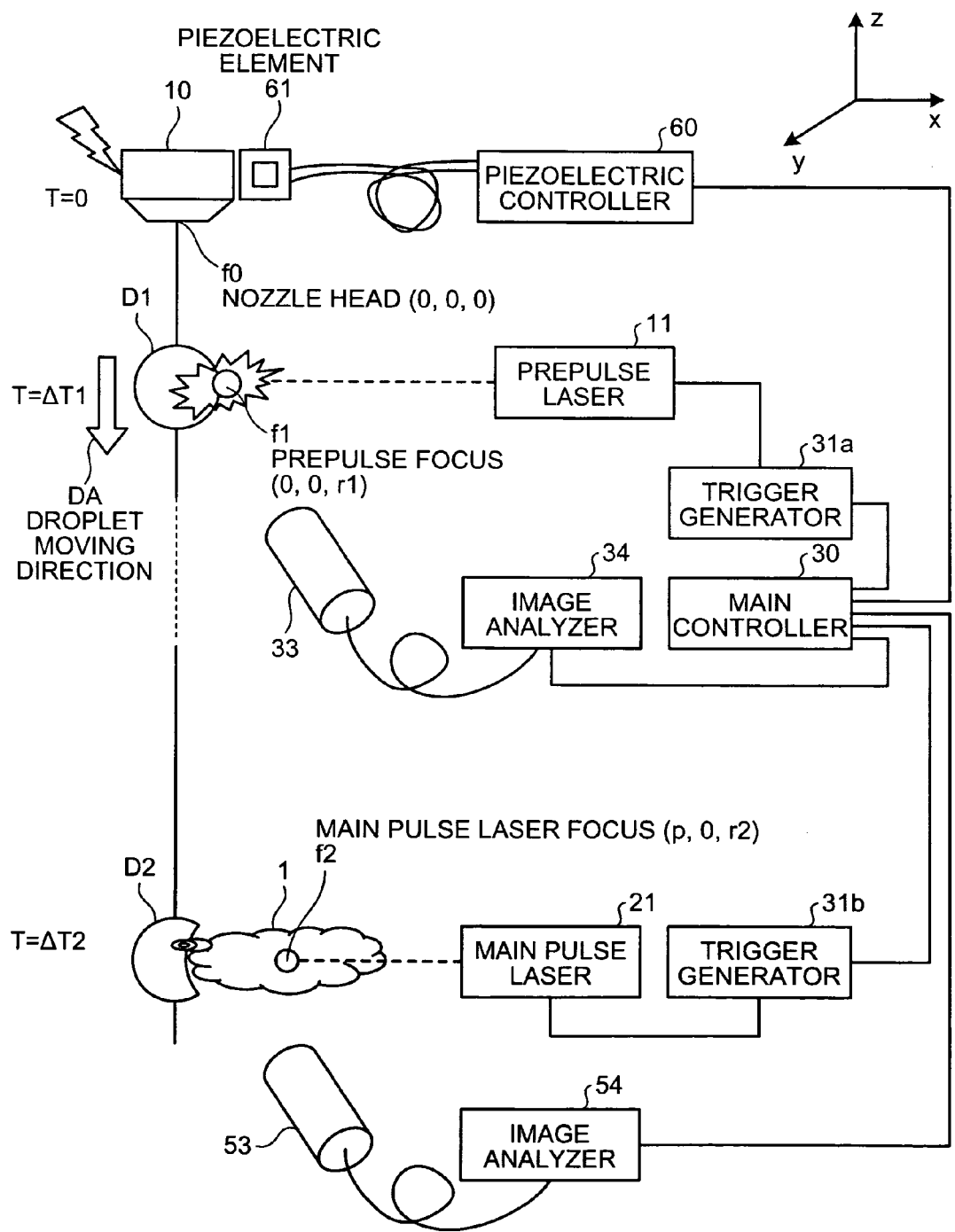
FIG. 9 is a schematic view showing a timing control system for droplet, prepulse and main pulse.

Next, timing control of the droplet D, the prepulse P1 and the main pulse P2 will be described in detail. FIG. 9 is a block diagram showing a structure of a timing control system. In FIG. 9, a piezoelectric element 61 for discharging a liquid metal as a droplet is mounted at the nozzle 10. This piezoelectric element 61 is connected to the main controller 30 and controls discharge timing of the droplet D. The piezoelectric element 61 discharges the droplet D at a predetermined rate by making an end of the nozzle 10 vibrate in the droplet moving direction DA. The rest of the structure is the same as the structure shown in FIG. 4, and the same reference numbers will be used for referring to the portions that are the same as the portions shown in FIG. 4. In addition, the CCD camera 33 and the image analyzer 34 are constructing an observation system for the prepulse P1, and the CCD camera 53 and the image analyzer 54 are constructing an observation system for the main pulse P2.

Firstly, at timing of T=0, a control signal for discharging the droplet D is transmitted from a piezoelectric controller 60 to the piezoelectric element 61, and the droplet D is discharged from a position ID. The droplet D arrives at a focus position f1 after a predetermined time ΔT1 from the timing T=0. Here, a trigger generator 31a may be controlled so that the droplet D is irradiated with the prepulse P1 at that moment.

However, every droplet D does not necessarily arrive the focus position f1 of the prepulse P1 after the same time period from discharging. This is because of instability of the droplet D, and occurrence of long-time transformation of the droplet D caused by thermal transformation of structures such as the chamber (not shown), and so on. That is, due to various causes, there are possibilities of traveling times of the droplets D from the discharge position f0 to the focus position f1 of the prepulse P1 changing. Therefore, it is necessary to monitor the arrival of the droplet D at the focus position P1 of the prepulse f1, and control the irradiating timing of the prepulse P1 in order to irradiate the droplet D with the prepulse P1 at the focus position f1 of the prepulse P1.

For this reason, the image of the plasma luminescence at a time of the droplet D being irradiated with the prepulse P1 is taken using the CCD camera 33, and an oscillating timing of the prepulse P1 is changed via the trigger generator 31a such that the plasma luminescence can be constantly detected as being approximately the same intensity. The image analyzer 34 analyses the intensity of the plasma luminescence based on the image transmitted from the CCD camera 33, compares the analyzed intensity and an intensity of a plasma luminescence detected at appropriate timing, which is preliminarily stored, and determines as to whether the irradiating timing of the prepulse P1 is appropriate or not. The main controller 30 changes the timing of the trigger generator 31a based on the result of the determination about the irradiating timing, and controls to change the irradiating timing of the prepulse P1 to control the irradiating timing to become adequate.

Likewise, an image of the luminescence of the pre-plasma 1 generated from the droplet D at timing T (i.e. after a time ΔT2 from the discharge timing of the droplet D) is taken by the CCD camera 33, and the irradiating timing of the main pulse P2 is controlled by the main controller 30 via the trigger generator 31b based on the result of the determination about the intensity of the plasma luminescence by the image analyzer 54, so that the pre-plasma 1 is irradiated with the main pulse P2 at the focus position f2. Here, in the case of the main pulse P2, the CCD camera 53 may directly detect the intensity of the EUV light.

In addition, in the embodiment described above, the droplet of the liquid metal Sn has been explained as an example. However, the present invention is not limited to such arrangement. Any kind of liquid metal may be used for the droplets. Moreover, although the case where the irradiating prepulse laser 11 is a 1.064 μm YAG laser and the main pulse laser 21 is a 10.6 μm $CO_2$ laser has been described, any irradiating laser can be used as long as the laser is able to make a droplet produce a desired EUV light.

Third Embodiment

In the first and second embodiments described above, the droplet as being a liquid target is used as a target. On the other hand, in a third embodiment, a solid target is used as a target.

Figure 10:
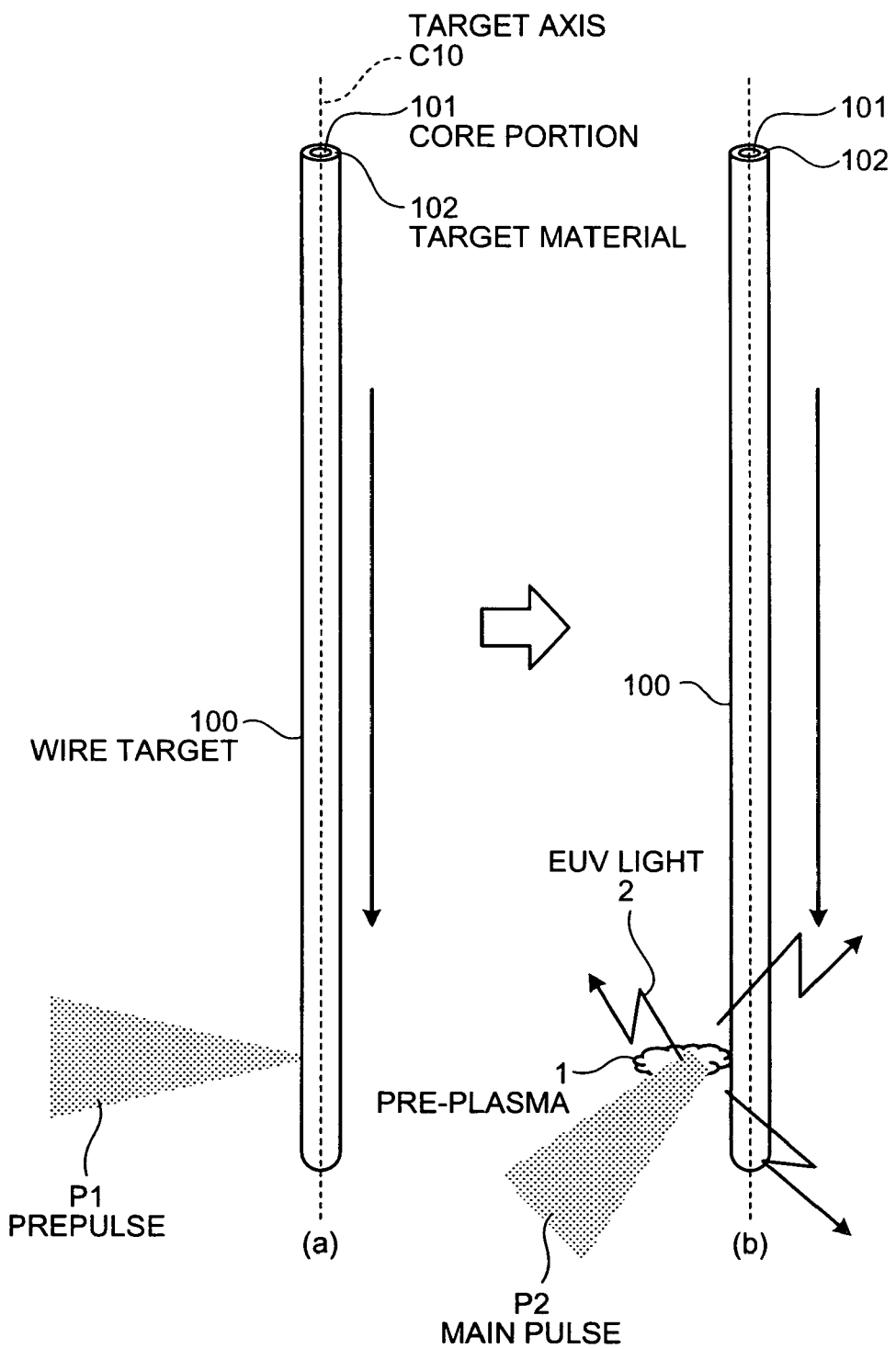
FIG. 10 is a view of operation statuses of an EUV light luminescence in a case where a wire target is used as a solid target for an extreme ultraviolet light source apparatus according to a third embodiment of the present invention.

FIG. 10 is a view of operation statuses of an EUV light luminescence in a case where a wire target is used as a solid target. The wire target 100 has a structure in that a core wire 101 being a piano wire (a steel wire made of a high-carbon steel) of high strength is coated with a target material 102 of Sn. The target material 102 can be formed by having the core wire 101 coated with a Sn metal by hot-dip plating while having the core wire 101 dunk in the fused Sn metal.

As with the droplet D moving along the droplet axis C1, the wire target 100 moves along a target axis C10 in a single direction, and is irradiated with the prepulse P1 at a predetermined cycle (shown in FIG. 10(a)). After that, a part of the target material 102 irradiated with the prepulse P1 generates the pre-plasma 1, a strong plasma is generated by irradiating the pre-plasma 1 with the main pulse P2 at the predetermined cycle, and the EUV light 2 is emitted from the strong plasma (shown in FIG. 10(b)).

The wire target 100 is let out from a drum by which the wire target 100 is being preliminary taken up, and the used wire target 100 which has a residual target material 102 remaining on the core wire 101 is taken up by another drum. The used wire target 100 can be put off together with this another drum.

In addition, it is possible to reuse the wire target 100 by looping the wire target 100. In this case, the used wire target 100 is recycled into a new wire target 100 by cooling down the heated target material 102 on the used wire target 100 using a cooling function, and recoating or supplementarily coating the core wire 101 with a target material 102 using a recycling system.

In the case of using the wire target 100, due to the debris changing from solid to liquid and finally to gas, thermal energy (latent heat in a shift from solid to liquid phase) is required unlike the case of the droplet D, and thus, a yield of neutral particles can be reduced. Moreover, optimization of a density state of the pre-plasma 1 generated from the wire target 100 can be controlled more easily compared with the case of generating the pre-plasma 1 from the droplet D, and it makes it possible to increase the conversion efficiency (CE).

Alternate Example 1 of Third Embodiment

Figure 11:
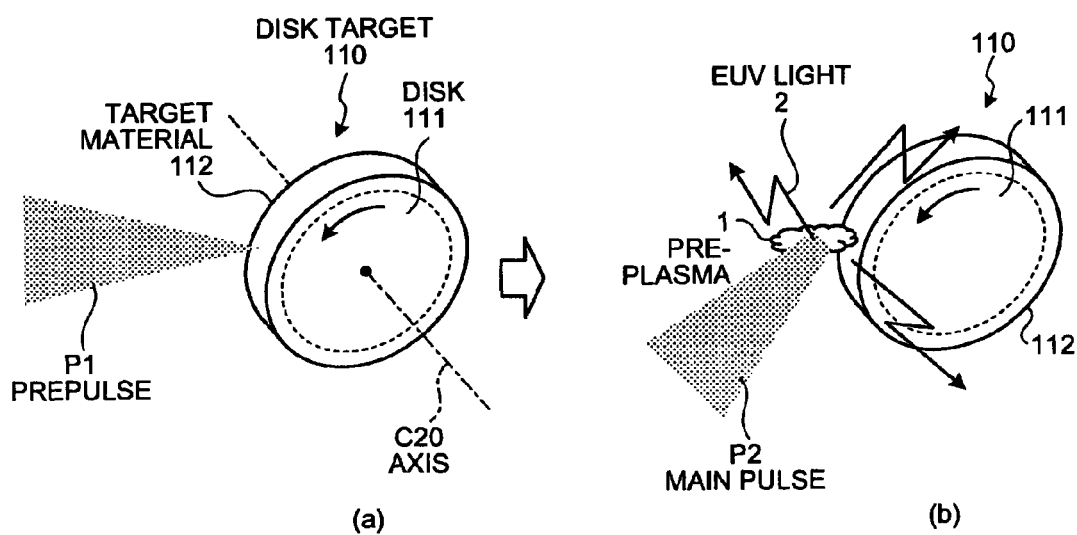
FIG. 11 is a view of operation statuses of an EUV light luminescence in a case where a disk target is used as a solid target for an extreme ultraviolet light source apparatus according to an alternate example 1 of the third embodiment of the present invention.

In this alternate example 1, a disk target 110 is used as the target in place of the wire target 100. As shown in FIG. 11, in the disk target 110, a rim of the disk 111 is coated with a target material 112 of Sn. When the target material 112 is irradiated with the prepulse P1 from an external diameter direction at the predetermined cycle in a state that the disk target 110 is rotating around an axis C20 as being a rotating center (shown in FIG. 11(a)), the pre-plasma 1 is generated. By irradiating this pre-plasma 1 with the main pulse P2 at the predetermined cycle, strong plasma is generated and the EUV light 2 is emitted (shown in FIG. 11(b)).

In this case, by arranging that a trajectory of the prepulse P1 on the rim of the disk target 110 to be irradiated with the prepulse P1 becomes a volute, it becomes possible to provide a comparatively long time luminescence of the EUV light 2. As is obvious, by recycling the target material 112 using the cooling system and the recycling system, it is possible to provide a continuous luminescence of the EUV light 2.

In this alternate example 1, in the case of using the disk target 110, due to the debris changing from solid to liquid and finally to gas, thermal energy (latent heat in a shift from solid to liquid phase) is required unlike the case of the droplet D, and thus, a yield of neutral particles can be reduced. Moreover, optimization of a density state of the pre-plasma 1 generated from the disk target 110 can be controlled more easily compared with the case of generating the pre-plasma 1 from the wire target 100, and it makes it possible to increase the conversion efficiency (CE).

Alternate Example 2 of Third Embodiment

Figure 12:
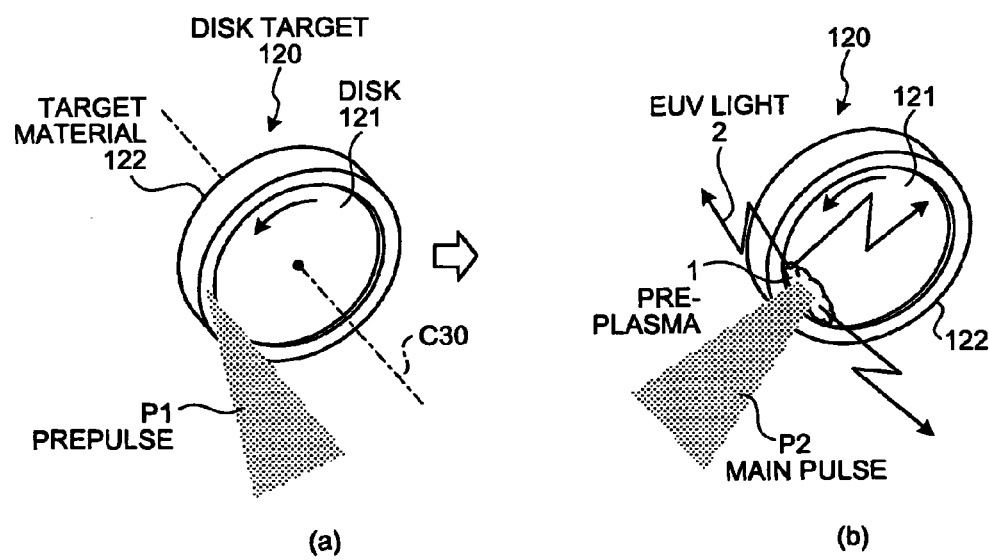
FIG. 12 is a view of operation statuses of an EUV light luminescence in a case where a disk target is used as a solid target for an extreme ultraviolet light source apparatus according to an alternate example 2 of the third embodiment of the present invention.

In this alternate example 2, although a disk target 120 with a disk shape like in the case of the alternate example 1 is used, a disk 121 is coated with a target material 122 of Sn not on the rim but on a most outer circumference of one side thereof. When the target material 122 is irradiated with the prepulse P1 from around an axis C30 at the predetermined cycle in a state that the disk target 120 is rotating around the axis C30 as being as a rotating center (shown in FIG. 12(a)), the pre-plasma 1 is generated. By irradiating this pre-plasma 1 with the main pulse P2 at the predetermined cycle, strong plasma is generated and the EUV light 2 is emitted (shown in FIG. 12(b)).

In this case, by arranging that a trajectory of the prepulse P1 on the target material 122 to be irradiated with the prepulse P1 becomes spiral, it becomes possible to provide a comparatively long time luminescence of the EUV light 2. As is obvious, by recycling the target material 122 using the cooling system and the recycling system, it is possible to provide a continuous luminescence of the EUV light 2.

In this alternate example 2, in the case of using the disk target 120, due to the debris changing from solid to liquid and finally to gas, thermal energy (latent heat in a shift from solid to liquid phase) is required unlike the case of the droplet D, and thus, a yield of neutral particles can be reduced. Moreover, optimization of a density state of the pre-plasma 1 generated from the disk target 120 can be controlled more easily compared with the case of generating the pre-plasma 1 from the wire target 100, and it makes it possible to increase the conversion efficiency (CE).

Alternate Example 3 of Third Embodiment

Figure 13:
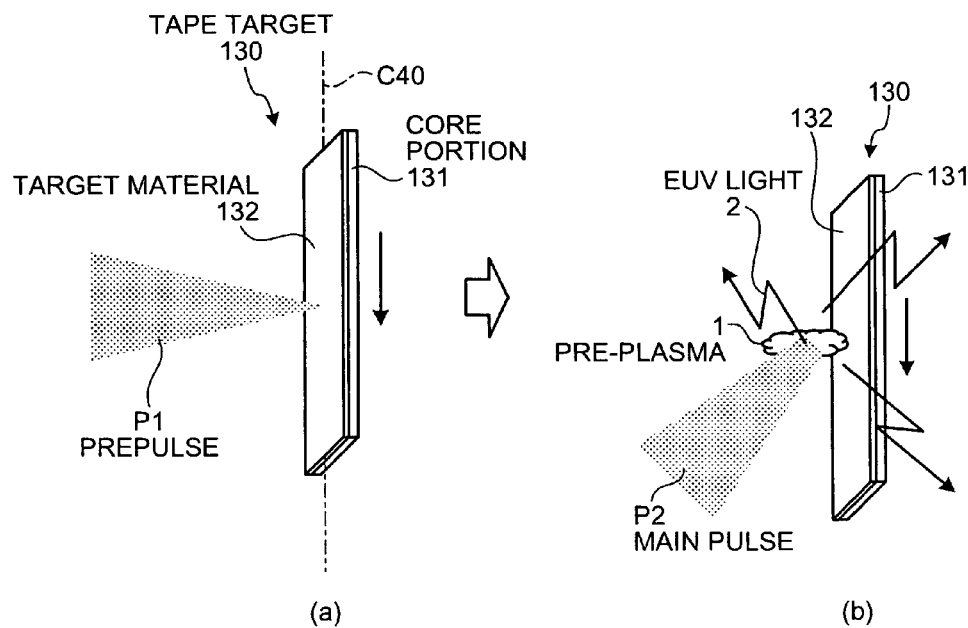
FIG. 13 is a view of operation statuses of an EUV light luminescence in a case where a tape target is used as a solid target for an extreme ultraviolet light source apparatus according to an alternate example 3 of the third embodiment of the present invention.

In this alternate example 3, a tape target 130 is used as a solid target. As shown in FIG. 13, in the tape target 130, one wide face of a core portion 131 is coated with a target material 132 of Sn. When the target material 132 is irradiated with the prepulse P1 from an approximate perpendicular direction to a face of the target material 132 at the predetermined cycle in a state that the disk target 130 is rotating around the axis C30 as being as a rotating center (shown in FIG. 13(a)), the pre-plasma 1 is generated. By irradiating this pre-plasma 1 with the main pulse P2 at the predetermined cycle, strong plasma is generated and the EUV light 2 is emitted (shown in FIG. 13(b)).

In this case, when the tape target 130 is nonreusable, by moving the tape target 130 in a loop so that a trajectory of the prepulse P1 on the target material 132 to be irradiated with the prepulse P1 is sequentially shifted in a direction perpendicular to a target axis C40, it is possible to provide a comparatively long time luminescence of the EUV light 2. As is obvious, by recycling the target material 132 using the cooling system and the recycling system while looping the tape target 130, it is possible to provide a continuous luminescence of the EUV light 2.

In this alternate example 3, in the case of using the tape target 130, due to the debris changing from solid to liquid and finally to gas, thermal energy (latent heat in a shift from solid to liquid phase) is required unlike the case of using the droplet D, and thus, a yield of neutral particles can be reduced. Moreover, optimization of a density state of the pre-plasma 1 generated from the tape target 130 can be controlled more easily compared with the case of generating the pre-plasma 1 from the wire target 100, and it makes it possible to increase the conversion efficiency (CE).

Alternate Example 4 of Third Embodiment

Figure 14:
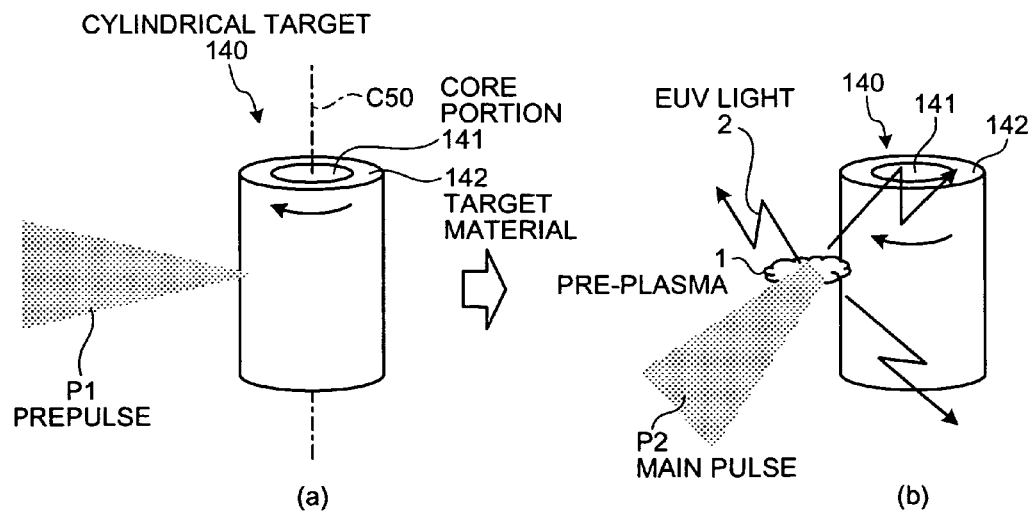
FIG. 14 is a view of operation statuses of an EUV light luminescence in a case where a cylindrical target is used as a solid target for an extreme ultraviolet light source apparatus according to an alternate example 4 of the third embodiment of the present invention.

In this alternate example 4, a cylindrical target 140 is used as a solid target. As shown in FIG. 14, a circumference of a cylindrical core portion 141 is coated with a target material 142 of Sn. When the target material 142 is irradiated with the prepulse P1 from an approximate perpendicular direction to a face of the target material 142 at the predetermined cycle in a state that the cylindrical target 140 is rotating around the axis C50 as being a rotating center (shown in FIG. 14(a)), the pre-plasma 1 is generated. By irradiating this pre-plasma 1 with the main pulse P2 as the predetermined cycle, strong plasma is generated and the EUV light 2 is emitted (shown in FIG. 14(b)).

In this case, by arranging that a trajectory of the prepulse P1 on the target material 142 being to be irradiated with the prepulse P1 becomes volute, it is possible to provide a comparatively long time luminescence of the EUV light 2. As is obvious, by recycling the target material 142 using the cooling system and the recycling system, it is possible to provide a continuous luminescence of the EUV light 2.

In this alternate example 4, in the case using the cylindrical target 140, due to the debris changing from solid to liquid and finally to gas, thermal energy (latent heat in a shift from solid to liquid phase) is required unlike the case of the droplet D, a yield of neutral particles can be reduced. Moreover, optimization of a density state of the pre-plasma 1 generated from the cylindrical target 140 can be controlled more easily compared with the case of generating the pre-plasma 1 from the wire target 100, and it makes it possible to increase the conversion efficiency (CE).

Alternate Example 5 of Third Embodiment

Figure 15:
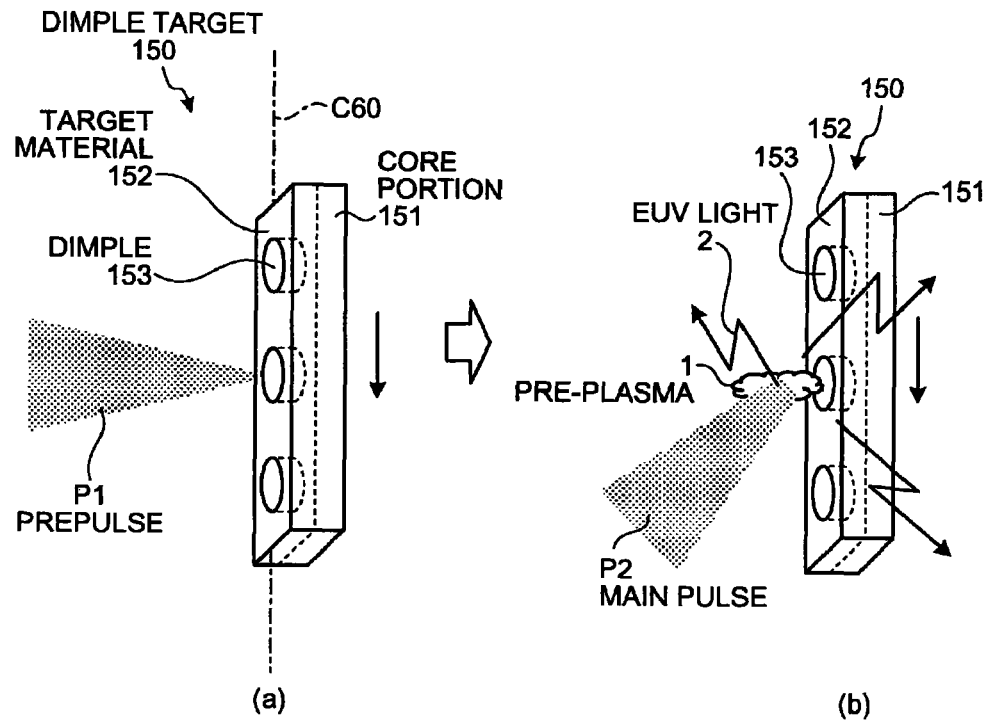
FIG. 15 is a view of operation statuses of an EUV light luminescence in a case where a trench target is used as a solid target for an extreme ultraviolet light source apparatus according to an alternate example 5 of the third embodiment of the present invention.

In this alternate example 5, a dimple target 150 having dimples is used as a solid target. As shown in FIG. 15, the dimple target 150 is the same as the tape target 130 shown in FIG. 13, expect that the dimples 153 are formed on a front surface of the dimple target 150. That is, in the dimple target 150, the dimples 153 formed on one wide front face of a tape-type core portion 151 are coated with the target materials 152. The dimples 153 are arrayed along a direction of a target axis C60. Although the dimples 153 are formed on the tape-type target material 152, it is possible to form the dimples 153 by having dimples provided on a surface of the core portion 151 while the target material 152 is to be formed and having the core portion 151 including the dimples coated with the target material 152.

When the target material 153 is irradiated with the prepulse P1 from an approximately perpendicular direction to a face of the target material 152 at the predetermined cycle being synchronized with the positions of the dimples 153 in a state that the dimple target 150 is moving in the direction of the target axis C60 (shown in FIG. 15(a)), the pre-plasma 1 is generated. By irradiating this pre-plasma 1 with the main pulse P2 at the predetermined cycle, strong plasma is generated and the EUV light 2 is emitted (shown in FIG. 15(b)).

In this alternate example 5, in the case of using the dimple target 150, due to the debris changing from solid to liquid and finally to gas, thermal energy (latent heat in a shift from solid to liquid phase) is required unlike the case of the droplet D, a yield of neutral particles can be reduced. Moreover, optimization of a density state of the pre-plasma 1 generated from the dimple target 150 can be controlled more easily compared with the case of generating the pre-plasma 1 from the tape target 130, and it makes it possible to increase the conversion efficiency (CE).

In addition, the dimples 153 as described in the alternate example 5 can be applied to anyone of the above described third embodiment and alternate examples 1 to 4 of the third embodiment. Forming these dimples 153 enables generation of a higher density pre-plasma 1, whereby the conversion efficiency (DE) can be further increased.

Furthermore, in each of the alternate examples 1 to 5, the whole target can be made from Sn material. For instance, in the alternate example 1, the whole disk target 110 can be made from Sn.

Fourth Embodiment

Next, a fourth embodiment of the present invention will be described in detail. In the fourth embodiment, a picosecond pulse laser that outputs a pulse of which pulse time width becomes equal to or less than a picosecond is used as the prepulse laser 11 shown in FIG. 4. Here, the picosecond pulse laser outputting a pulse of which pulse time width T is equal to or less than a picosecond means a pulse laser of which pulse width T is less than 1ns (T<1 ns).

Figure 16:
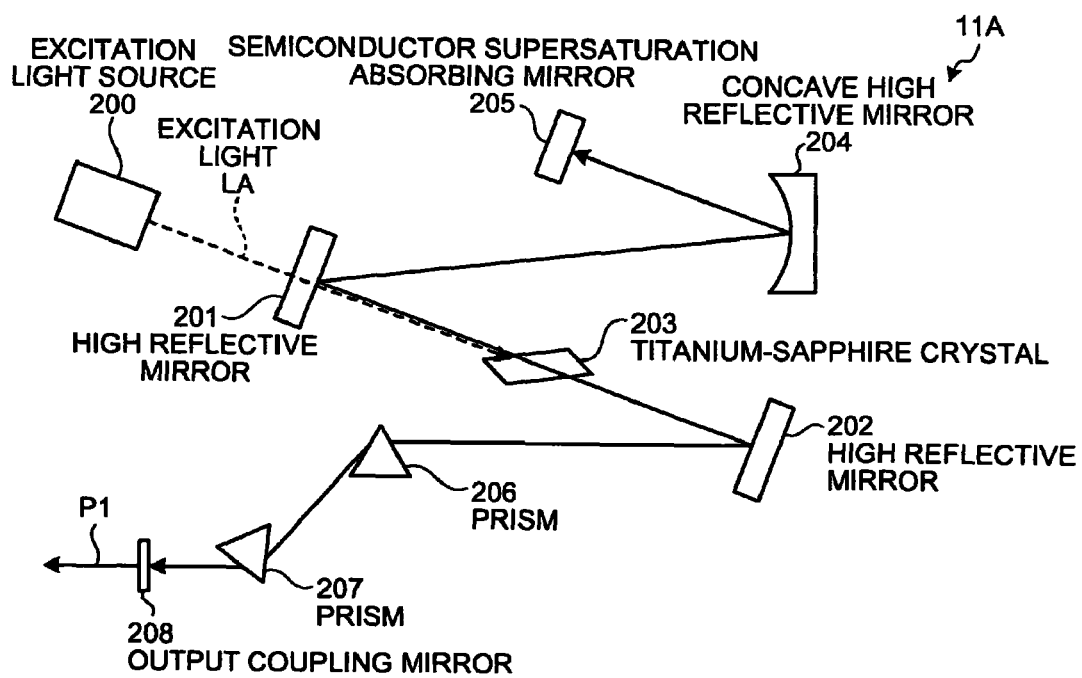
FIG. 16 is a schematic view showing a structure of a prepulse laser for an extreme ultraviolet light source apparatus according to a fourth embodiment of the present invention.

FIG. 16 is a schematic diagram showing a structure of the prepulse laser according to the fourth embodiment of the present invention. In FIG. 16, the prepulse laser 11A is a self-mode-locking titanium-sapphire laser. The prepulse laser 11A has a titanium-sapphire crystal 203 as being a laser agency arranged in between face-to-face high reflective mirrors 201 and 202. An excitation light LA oscillated at an excitation light source 200 enters the titanium-sapphire crystal 203 via the high reflective mirror 201. The excitation light source 200 outputs a second harmonic (532 nm) of a semiconductor laser excitation Nd:YVO4 or a semiconductor excitation Nd:YAG as the excitation light LA. The titanium-sapphire crystal 203 is optically excited by the excitation light LA, and emits a light with 800 nm, for instance. The high reflective mirror 201 lets the excitation light LA pass through and highly reflects the light emitted from the titanium-sapphire crystal 203. On the other hand, the reflective mirror 202 highly reflects the light emitted from the titanium-sapphire crystal 203.

A semiconductor supersaturation absorbing mirror 205 and an output coupling mirror 208 form a laser resonator. The light reflected by the high reflective mirror 201 is collected on the semiconductor supersaturation absorbing mirror 205 by a concave high reflective mirror 204. On the other hand, the light reflected by the high reflective mirror 202 is waveguided to the output coupling mirror 208 through prisms 206 and 207. The output coupling mirror 208 outputs a part of light inside the laser resonator to the outside as the prepulse P1.

When the titanium-sapphire crystal 203 is irradiated with the excitation light LA from the excitation light source 200 via the high reflective mirror 201, a longitudinal-mode in the laser resonator oscillates while mode-locking due to supersaturation absorption of the semiconductor supersaturation absorbing mirror 205, and an inverted distribution energy accumulated in the titanium-sapphire crystal 203 is outputted from the output coupling mirror 208 as an optical pulse (the prepulse P1) having been concentrated within a short time (picosecond).

When the target such as the droplet D is irradiated with the prepulse P1 of which time width is equal to or less than a picosecond, only a thin surface of the target is ionized to generate the pre-plasma because the time width is an enormously short period of time as equal to or less than a picosecond. Therefore, in the case of using the droplet D, due to the target becoming harder to break up, dispersion and debris of the target can be reduced. Moreover, also in the case where the target is the solid target, dispersion and debris of the target can be reduced while breakage inside the target can be prevented at the same time. Furthermore, because such pulse of which time width is equal to or less than a picosecond is generated, a peak power of the pulse becomes higher. Accordingly, it is possible to generate pre-plasma even with using a low energy pulse, whereby miniaturization of the device can be enhanced.

Alternate Example 1 of Fourth Embodiment

Figure 17:
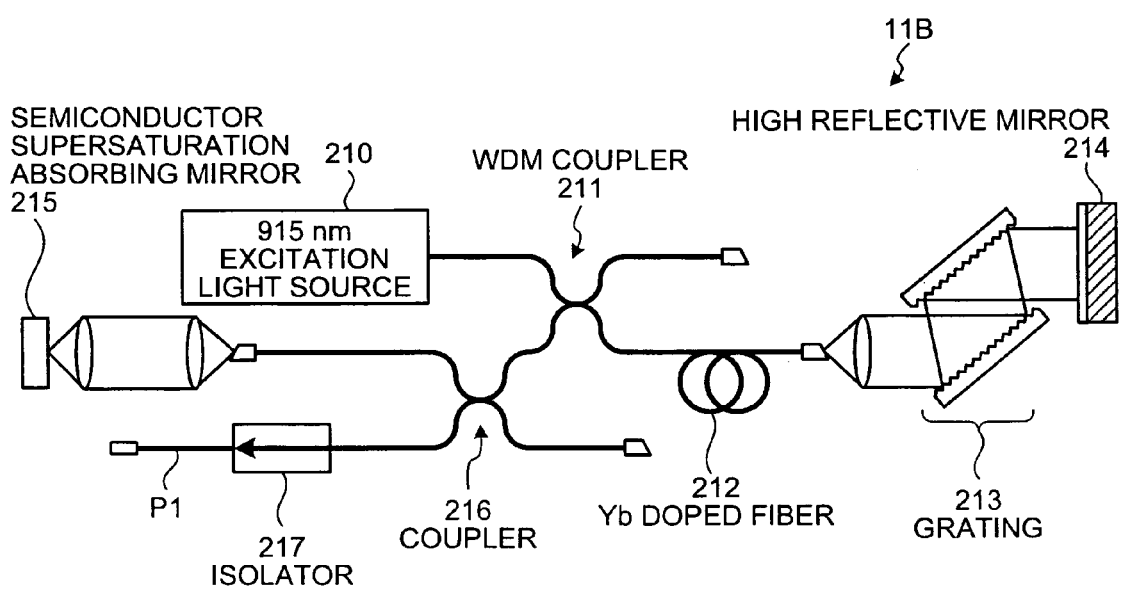
FIG. 17 is a schematic view showing a structure of a prepulse laser for an extreme ultraviolet light source apparatus according to an alternate example 1 of the fourth embodiment of the present invention.

Here, it is possible to generate the prepulse P1 of which time width is equal to or less than a picosecond even with a fiber laser. FIG. 17 is a schematic diagram showing a structure of a prepulse laser according to an alternate example 1 of the fourth embodiment of the present invention. The prepulse laser 11B has a semiconductor supersaturation absorbing mirror 215 which is mounted on one end of the Yb doped fiber 212 being an amplifiable agency via an optical system, and a high reflective mirror 214 mounted on the other end of the Yb doped fiber 212 via a grating 213. A laser resonator is formed between the semiconductor supersaturation absorbing mirror 215 and the high reflective mirror 214. A 915 nm excitation light outputted from a 915 nm excitation light source 210 enters the Yb doped fiber 212 via a WDM coupler 211. The Yb doped fiber 212 is excited by the inputted 915 nm light, and outputs a 980 nm light. The 980 nm light is a mode-locked picosecond pulse generated by the longitudinal-mode inside the laser resonator locked by the semiconductor supersaturation absorbing mirror 215 while wave selection is executed via the grating 213, and is outputted via a coupler 216 and an optical isolator 217 as the prepulse P1.

In this alternate example 1, while the same effect as the fourth embodiment benefitted by the picosecond pulse can be achieved, it is possible to irradiate the target with the prepulse P1 easily and with high accuracy because the prepulse P1 can be waveguided using the optical fiber. Furthermore, because a value of $M^2$ which shows a quality of a lateral-mode of a fiber laser is about 1.2, light focusing performance can become high, and it is possible to irradiate the target with the prepulse P1 with high accuracy even if the target is small.

In addition, if energy of the prepulse P1 equal to or less than a picosecond is small, it is possible to amplify the prepulse P1 using a regenerative amplifier. Moreover, a femtosecond laser outputting a pulse of which pulse time width becomes a femtosecond can be applied to achieve the same effect as in the case of using the picosecond laser.

Moreover, the shorter the wavelength of the prepulse P1 is, the higher the absorbency index of Sn being the target becomes. Therefore, it is desirable that the wavelength of the prepulse P1 is as short as possible. For instance, in a case of using Nd:YAG laser, absorbency indexes become higher in order of a wavelength of the Nd:YAG laser=1064 nm, a wavelength of twice the harmonic thereof=532 nm, a wavelength of thrice the harmonic thereof=355 nm, and a wavelength of quadruply the harmonic thereof=266 nm, and by adopting the prepulse P1 with a short wavelength, it becomes possible to generate pre-plasma with high density, whereby the conversion efficiency (CE) can be increased.

As explained above, according to each of the above described embodiments, the prepulse laser light source generates pre-plasma at the different region different from the target region, which is on the incident side of the prepulse laser light, while a part of the target remains as the target is irradiated with the prepulse laser light, and the main pulse laser light source generates the extreme ultraviolet light by irradiating the pre-plasma with the main pulse laser light. Thereby, the debris are generated only from the pre-plasma. By this arrangement, a light source being reliable for a long time and being able to reduce an yield of debris can be provided.

In addition, the above-mentioned embodiments and the alternate examples can be arbitrarily combined with one another.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept of the invention as defined by the appended claims and their equivalents.

What is claimed is:

1. An extreme ultraviolet light source apparatus for generating an extreme ultraviolet light by irradiating a target with main pulse laser light after irradiating the target with prepulse laser light, the extreme ultraviolet light source apparatus comprising:

a prepulse laser light source configured for generating pre-plasma by irradiating the target with the prepulse laser light, the pre-plasma being generated at a different region from a target region, the target region being on a traveling trajectory of the target, the different region being located on an incident side of the prepulse laser light relative to the target region, a part of the target remaining after the irradiation of the target;

a stage configured for adjusting a collector mirror for collecting the prepulse laser light;

a CCD camera for imaging a luminescence of the pre-plasma;

an image analyzer configured for specifying a luminescence position of the pre-plasma based on an imaging result by the CCD camera; and a focus position controller configured for adjusting a focus position of the prepulse laser light by controlling the stage based on a specifying result by the image analyzer.

2. The extreme ultraviolet light source apparatus according to claim 1, wherein an irradiation intensity of the prepulse laser light is equal to or greater than $10^7$ W/cm$^2$ but not exceeding $10^9$ W/cm$^2$.

3. The extreme ultraviolet light source apparatus according to claim 1, further comprising a main pulse laser light source generating the extreme ultraviolet light by irradiating the pre-plasma with the main pulse laser light, wherein the main pulse laser light source emits the main pulse laser light only to the pre-plasma.

4. The extreme ultraviolet light source apparatus according to claim 1, wherein the prepulse laser light source is a picosecond pulse laser generating a pulse of which time width is equal to or less than a picosecond.

5. The extreme ultraviolet light source apparatus according to claim 1, wherein the target is a droplet, and the prepulse laser light source emits the prepulse laser light with such intensity that lets a part of the droplet remain after the droplet is irradiated with the prepulse laser light.

6. The extreme ultraviolet light source apparatus according to claim 5, further comprising:

a catcher with an aperture for retrieving a residual target after the droplet is irradiated with the prepulse laser light and a remaining debris in the pre-plasma, the catcher being placed on a moving axis of the target, wherein the prepulse laser light source irradiates the target with the prepulse laser light from an opposite direction to the moving direction of the target, the opposite direction approximately conforming to a moving axis of the target.

7. The extreme ultraviolet light source apparatus according to claim 5, wherein an irradiation intensity of the prepulse laser light is equal to or greater than $10^7$ W/cm$^2$ but not exceeding $10^9$ W/cm$^2$.

8. The extreme ultraviolet light source apparatus according to claim 5, further comprising a main pulse laser light source generating the extreme ultraviolet light by irradiating the pre-plasma with the main pulse laser light, wherein the main pulse laser light source irradiates only the pre-plasma with the main pulse laser light.

9. The extreme ultraviolet light source apparatus according to claim 5, wherein the prepulse laser light source is a picosecond pulse laser generating a pulse of which time width is equal to or less than a picosecond.

10. The extreme ultraviolet light source apparatus according to claim 5, further comprising a catcher with an aperture for retrieving a residual target after the droplet is irradiated with the prepulse laser light and a remaining debris in the pre-plasma, the catcher being placed on a moving axis of the target, wherein the prepulse laser light source is positioned to produce the prepulse laser light so as to intersect with the moving axis of the target by at an acute angle.

11. The extreme ultraviolet light source apparatus according to claim 1, wherein the target is a solid target.

12. The extreme ultraviolet light source apparatus according to claim 11, further comprising:

a catcher with an aperture for retrieving a residual target after the droplet is irradiated with the prepulse laser light and a remaining debris in the pre-plasma, the catcher being placed on a moving axis of the target, wherein the prepulse laser light source irradiates the target with the prepulse laser light from an opposite direction to the moving direction of the target, the opposite direction approximately conforming to a moving axis of the target.

13. The extreme ultraviolet light source apparatus according to claim 11, wherein an irradiation intensity of the prepulse laser light is equal to or greater than $10^7$ W/cm$^2$ but not exceeding $10^9$ W/cm$^2$.

14. The extreme ultraviolet light source apparatus according to claim 11, wherein the prepulse laser light source is a picosecond pulse laser generating a pulse of which time width is equal to or less than a picosecond.

15. The extreme ultraviolet light source apparatus according to claim 1, wherein the prepulse laser light source emits the prepulse laser light with such intensity that lets ablation occur in a part of the target.

16. The extreme ultraviolet light source apparatus according to claim 15, wherein an irradiation intensity of the prepulse laser light is equal to or greater than $10^7$ W/cm$^2$ but not exceeding $10^9$ W/cm$^2$.

17. The extreme ultraviolet light source apparatus according to claim 15, wherein the prepulse laser light source is a picosecond pulse laser generating a pulse of which time width is equal to or less than a picosecond.

18. An extreme ultraviolet light source apparatus for generating an extreme ultraviolet light by irradiating a target with main pulse laser light after irradiating the target with prepulse laser light, the extreme ultraviolet light source apparatus comprising:

a prepulse laser light source configured for generating pre-plasma by irradiating the target with the prepulse laser light, the pre-plasma being generated at a different region from a target region, the target region being on a traveling trajectory of the target, the different region being located on an incident side of the prepulse laser light relative to the target region, a part of the target remaining after the irradiation of the target;

a trigger generator configured for changing an oscillation timing of the prepulse laser light;

a CCD camera configured for imaging a luminescence of the pre-plasma;

an image analyzer for detecting a luminescence intensity of the pre-plasma based on an imaging result by the CCD camera; and a focus position controller configured for adjusting the oscillation timing of the prepulse laser light by controlling the trigger generator based on a detection result by the image analyzer.

* * * * *